United States Patent

[11] 3,594,593

[72] Inventors Raymond Y-C Ho
Menlo Park;
Alfred J. Bahr, Mountain View, both of, Calif.

[21] Appl. No. 821,269
[22] Filed May 2, 1969
[45] Patented July 20, 1971

[73] Assignee Stanford Research Institue
Menlo Park, Calif.

[54] ACTIVE IMPEDANCE MATCHING OF MICROWAVE ACOUSTIC DEVICES
4 Claims, 5 Drawing Figs.

[52] U.S. Cl. 307/295, 307/293, 333/32, 333/80 T
[51] Int. Cl. H03h 7/38
[50] Field of Search 307/295; 333/32, 80, 80 T; 330/12, 20

[56] References Cited

UNITED STATES PATENTS

| | | | |
|---|---|---|---|
| 2,852,751 | 9/1958 | Lundry | 333/80 X |
| 3,267,397 | 8/1966 | Skinner | 333/80 |
| 3,343,003 | 9/1967 | Arseneau | 333/80 UX |
| 3,437,947 | 4/1969 | Beekman | 330/20 |
| 3,483,477 | 12/1969 | Purnaiya et al. | 333/80 UX |

*Primary Examiner*—Roy Lake
*Assistant Examiner*—James B. Mullins
*Attorneys*—Urban H. Faubion and James Todorovic

ABSTRACT: The impedance of delay lines (particularly acoustic delay lines) is matched to the microwave source utilizing active networks synthesized from inverted common collector transistor circuits. The active inductance and negative resistance generated by the inverted common collector transistor circuits are connected across input terminals of the delay line and matching is improved by connecting an active negative resistance in series between source input terminal and a delay line input terminal.

RAYMOND Y. C. HO &
ALFRED J. BAHR
INVENTORS

BY

ATTORNEY

RAYMOND Y. C. HO &
ALFRED J. BAHR
INVENTORS

BY Urban H. Faubion

ATTORNEY

ACTIVE IMPEDANCE MATCHING OF MICROWAVE ACOUSTIC DEVICES

BACKGROUND OF THE INVENTION

1. Field of the Invention

This invention relates to impedance matching between microwave acoustic devices and their source with low insertion loss, and particularly concerns the novel application of an inverted common collector transistor circuit as disclosed and claimed in the copending patent application Ser. No. 821,317 entitled "Active Microwave Inductive or Filter Element and Applications" of David K. Adams and Raymond Y-C. Ho filed May 2, 1969 and assigned to the assignee of the present invention.

2. Relation to Prior Art

In order to obtain the relatively long delays frequently required in pulsed circuits at microwave frequencies, acoustic delay lines are commonly used. Matching the delay line to the pulse source is required to prevent unwanted reflections or echoes and loss of the applied power. An impedance matching network is used for this purpose.

Consider a one-port acoustic delay line as being composed of two parts: the transducer (from electromagnetic to acoustic energy) and the substrate. It is possible to build passive matching networks that will provide a match into a microwave acoustic delay line but much of the power available from the source is lost in the transducer and matching network rather than being translated into acoustic form. This is so because the maximum electromagnetic to acoustic coupling is generally not large and because the transducer behaves in large measure as a capacitor thus presenting a rather low input impedance at high frequencies. Also, because of the way losses are distributed, it is usually not possible to achieve a simultaneous match looking into the electrical port and acoustical port of the transducer.

OBJECTS AND SUMMARY OF THE INVENTION

It is therefore an object of the present invention to provide matching networks that make possible microwave acoustic devices with low insertion loss.

It is another object of this invention to provide an impedance match for acoustic transducers both looking into the acoustic and the electromagnetic ports.

It is a further object of this invention to provide acoustic delay lines and impedance matching networks which substantially eliminate echo trains and provide low insertion loss.

In carrying out the present invention, impedance matching between a source and an acoustic delay line is provided using an active inductance and negative resistance circuit synthesized from an inverted common collector transistor configuration across the device terminals and in a preferred arrangement, an active negative resistance, also utilizing an inverted common collector transistor circuit, is provided in series between the source and the transducer input.

BRIEF DESCRIPTION OF THE DRAWINGS

The novel features which are believed to be characteristic of the invention are set forth with particularity in the appended claims. The invention itself, however, both as to its organization and method of operation, together with further objects and advantages thereof, may best be understood by reference to the following description taken in conjunction with the accompanying drawings in which:

DESCRIPTION OF THE PREFERRED EMBODIMENTS

Figure 1:
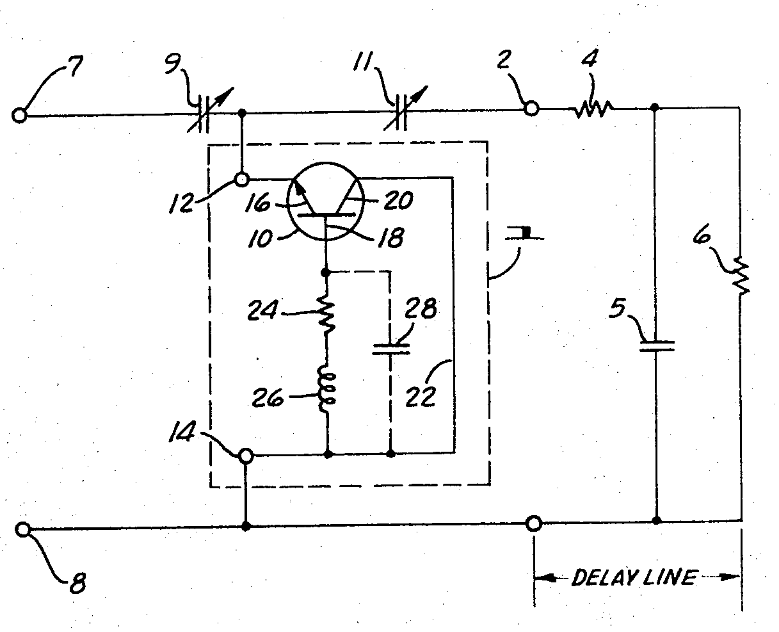
FIG. 1 is a schematic diagram showing a matched delay line circuit using a single transistor high-Q inductance circuit.

Referring specifically to FIG. 1, an acoustic delay line (so labeled) is illustrated by an equivalent circuit. The acoustic delay line used to obtain the data shown and described is a one-port device with a thin film cadmium sulfide (longitudinal mode) transducer and ruby substrate. The equivalent circuit is used since it is more meaningful in appreciating the matching problems involved.

Electrically, a transducer behaves essentially as a capacitor, and thus presents a rather low input impedance level at high frequencies. In order to represent the characteristics properly, the delay line equivalent circuit is shown with a resistor 4 and capacitor 5 connected serially between a pair of delay line input terminals 2 and 3 and another resistor 6 connected directly in parallel with capacitor 5.

The primary impedance matching component of the circuit illustrated in FIG. 1 constitutes the basic active inductance and negative resistance synthesized as illustrated and described in the copending Adams and Ho patent application previously cited (incorporated herein by reference). The active inductance and negative resistance circuit 1 includes transistor 10 which is provided with an emitter electrode 16, base electrode 18, and collector electrode 20. As illustrated, a lead or conductor 22 is provided which connects the collector electrode 20 directly to the reference or ground potential input terminal 14, hence the name "grounded collector." Emitter electrode 16 is connected directly to the input terminal 12 and the base electrode 18 is connected to the ground or reference terminal 14 through a circuit including base resistance 24 and base inductance 26. A base capacity 28 is also shown connected between the transistor base lead 18 and ground. However, it is illustrated as connected with broken lines primarily because it is an internal parasitic capacitance of the transistor 10. The base resistance 24 consists of transistor base disperse resistance plus external resistance if used. The base inductance 26 consists of a transistor lead parasitic plus external inductance if used.

A pair of input terminals 7 and 8 are provided for the matched delay line and the ground or reference potential terminals 3, 8 and 14 of the delay line, active inductance and negative resistance circuit 1 and matched delay line respectively are directly interconnected. The other input terminal 12 of active circuit 1 is connected to the other input terminal 7 of the matched circuit through a coupling capacitor 9 and to the other input terminal 2 of the delay line through a coupling capacitor 11. Both coupling capacitors 9 and 11 are variable for tuning purposes. Thus the active matching network is effectively connected across both the source and delay line input terminals in position to match the impedances.

Using a single inverted common collector transistor, as illustrated in FIG. 1, the matching-network parameters can be adjusted to match the transducer (delay line) either with respect to the incident pulse (looking into the electromagnetic port) or with respect to the echo pulse (looking into the acoustic port), but not simultaneously for both. These two situations are illustrated in FIGS. 2 and 3, respectively.

Figure 2:
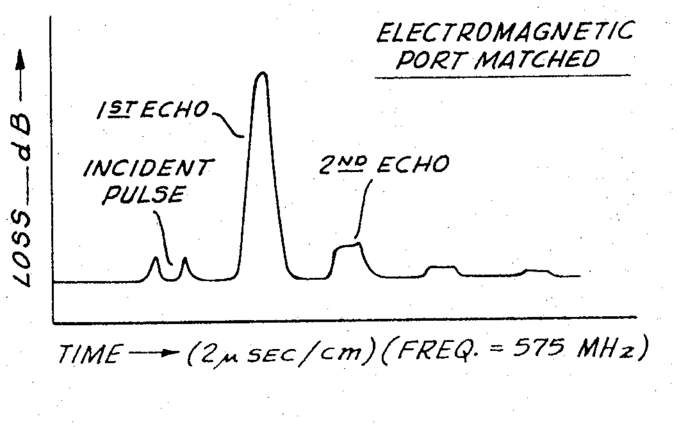
FIG. 2 is a graph taken from an actual scope trace for a frequency of 575 MHz. (Megahertz) and the electromagnetic port of an acoustic delay line matched as illustrated in the circuit of FIG. 1 with time in microseconds plotted along the axis of abscissae, and loss in db. plotted along the axis of ordinates.

An inspection of FIG. 2 shows that for the matching network parameters adjusted to match the electromagnetic port the first echo (the one giving the desired delay at the 575 MHz. frequency) is only down 4.6 db. whereas the return loss is 28.8 db. and the second echo is down 16.4 db. This compares with the delay line untuned (no matching) insertion loss for the first echo of 32 db. By using a stub tuner the first echo loss could be reduced to 13 db. and second echo to a level about 4 db. below the first echo.

Figure 3:
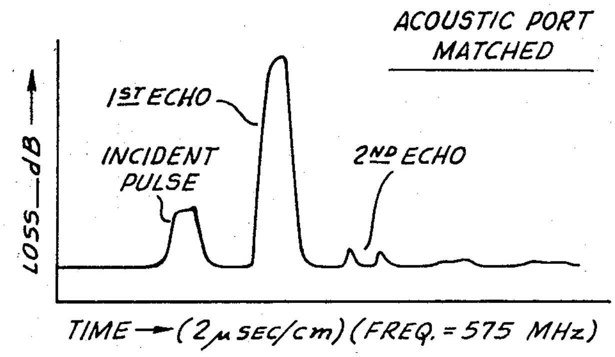
FIG. 3 is a graph for a frequency of 575 MHz. and the acoustic port of an acoustic delay line matched as illustrated in the circuit of FIG. 1 with time in microseconds plotted along the axis of abscissae and loss in db. plotted along the axis of ordinates and reproducing an actual scope trace.

FIG. 3, which is taken with parameters of matching network 1 adjusted to match the delay line acoustic port, shows the first echo loss to be only 1.7 db. with the return loss of 11 db. and the second echo down 33 db. It is noted that the match obtained for either case is very good and that in both cases (even without a simultaneous match at both ports) the insertion loss for the first echo is very low; it is essentially the transmission loss in the 2 cm.-long delay line rod.

For a better understanding of why the single active circuit 1 does not entirely compensate both ports, consider further the function of variable tuning and coupling capacitors 9 and 11. Capacitor 11 is used to transfer the impedance level of the load (delay line) to a convenient value. The negative resistance generated by the transistor 10 is used to compensate for the losses in the capacitor 11 and also for the losses associated with contact to the thin-film transducer (represented by resistor 4). The inductance generated by the transistor is then used to tune out the net capacitance of the load.

Variable capacitor 9 is used to transform the impedance level of the tuned load to that of the source. This capacitor also has some losses associated with it and this is the reason that the circuit cannot be adjusted to provide a simultaneous impedance match in both directions. In other words, since the two main sources of electrical loss appear in different loops of the circuit, a single transistor will not, in general, precisely compensate both simultaneously.

To compensate for the losses in capacitor 9 a second inverted common collector transistor circuit 1*a* is used to generate a negative resistance in series with capacitor 9. This arrangement (illustrated in FIG. 4) is the preferred embodiment since it provides a match for both electromagnetic and acoustic ports and renders the entire matching network and transducer essentially lossless. Since the second inverted common collector circuit 1*a* is added to the precise circuit of FIG. 1, for simplicity of illustration and description the circuit of FIG. 1 is shown with broken line arrows 1–1 looking into its input terminals 7 and 8 and it is not described again here. All corresponding elements of FIGS. 1 and 4 are given corresponding reference numerals.

The negative resistance providing circuit 1*a* like the basic active circuit 1 utilizes a transistor 34 connected in the "inverted common collector" configuration in series between input terminal 30 of the entire network and capacitor 9. That is, the transistor 34 is provided with an emitter electrode 36, base electrode 38, and collector electrode 40. To provide one part of the series connection, the emitter electrode 36 is connected to a variable coupling capacitor 52 which in turn is connected to terminal 9 of the matching network. The transistor base lead 38 completes the series connection and is connected to the network input terminal 30 through a circuit which includes serially connected base resistor 44, base inductor 46, and base coupling (variable) capacitor 50. The inverted common collector configuration is completed by connecting transistor collector electrode 40 to the same input terminal 30 to which the base electrode 38 is connected. A base shunt capacity 48 is shown connected between the transistor base lead 38 and input terminal 30 by broken lines primarily because it is an effective capacitance due to the base-collector connection.

Figure 4:
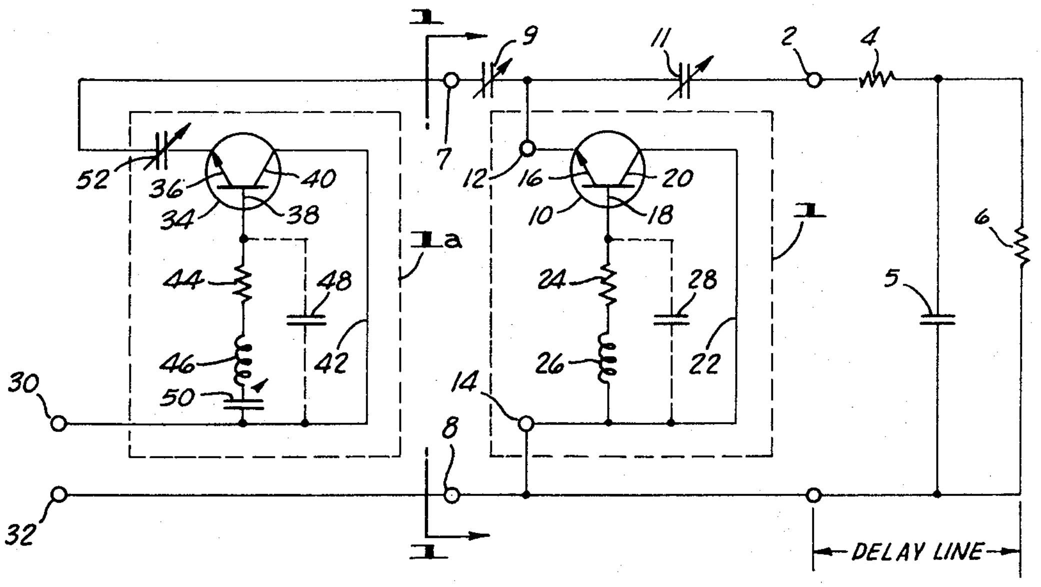
FIG. 4 is a schematic diagram of a preferred embodiment of the invention showing a matched delay line circuit using a second transistor circuit to provide an active negative resistance for additional matching.
Figure 5:
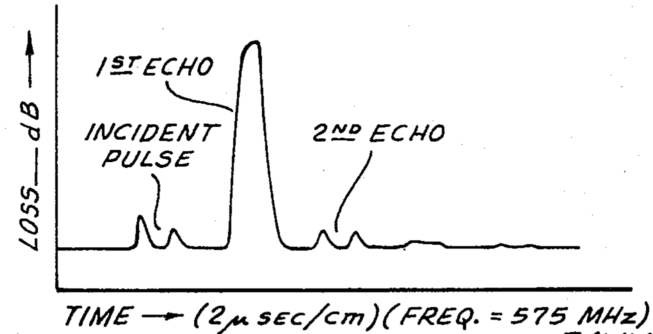
FIG. 5 is a graph (taken from an actual scope trace) illustrating the impedance match obtained using the circuit of FIG. 4, again at a frequency of 575 MHz. the graph showing time in microseconds plotted along the axis of abscissae and loss in db. plotted along the axis of ordinates and reproducing an actual scope trace.

The loss plot of FIG. 5 illustrates the superior results obtained using the circuit of FIG. 4 at a frequency of 575 MHz. The return loss and second pulse insertion loss are 31 and 37 db. respectively, while the first echo pulse insertion loss is only 3.2 db. The bandwidth over which the input voltage standing wave ratio (VSWR) for the input pulse is less than 1.2 is 0.12 percent (the minimum VSWR within this band is less than 1.05). However, the circuit was not designed for optimum bandwidth. The bandwidth can be increased by adding more matching sections of the proper design, or by using a negative impedance inverter to realize a negative capacitance that can be used to tune out the capacitance of the transducer. In the latter case the inverted common-collector transistor is used to realize the negative impedance inverter. In cases where the constancy of the negative resistance is critical, the ultimate bandwidth is determined by the shape of the negative resistance vs. frequency curve.

While particular embodiments of the invention have been shown, it will of course be understood that the invention is not limited to these specific embodiments, since many modifications both in the circuit arrangement and in the instrumentalities employed may be made. It is contemplated that the appended claims will cover any such modifications as fall within the true spirit and scope of this invention.

We claim:

1. In a microwave circuit including a microwave source having a pair of source terminals exhibiting an impedance and an acoustic microwave display line having a pair of delay line terminals exhibiting an impedance, an active impedance-matching network for matching the source impedance and the delay line impedance comprising series circuit means including first and second capacitive reactances series connected at a common terminal, said first capacitive reactance connected to one of the delay line terminals whereby the impedance of the delay line is transformed to a preselected value, means for connecting said second capacitive reactance to one of the source terminals, a reference potential terminal, the others of the source and delay line terminals connected to said reference potential terminal, parallel circuit means connected between said common terminal and said reference potential terminal, said parallel circuit means including an active inductance and negative resistance whereby said active inductance and negative resistance compensate for the capacitance and positive resistance both of the delay line and said first capacitive reactance to establish a tuned load impedance between said common terminal and said reference potential terminal, and said second capacitive reactance matches said tuned load impedance to the source impedance.

2. An active impedance-matching network in accordance with claim 1 wherein said means for connecting said second capacitive reactance to the source terminal comprises an additional active inductance and negative resistance whereby the positive resistance and capacitive reactance of said second capacitive reactance are compensated to match the tuned load impedance to the source impedance.

3. An active impedance-matching network and delay line as defined in claim 2 wherein said active inductance and negative resistance includes a transistor having emitter, collector, and base electrodes, said emitter electrode connected to said common terminal, base circuit means connecting said base electrode to said reference potential terminal, collector circuit means connecting said collector electrode to said reference potential terminal; said additional active inductance and negative resistance including a second transistor having emitter collector and base electrodes, emitter means connecting the emitter electrode of said second transistor to the emitter electrode of said first transistor through said second series connected capacitive reactance and individual base and collector circuit means connecting the said base and collector electrodes of said second transistor to said one source terminal.

4. An active impedance-matching network and delay line as defined in claim 1 wherein said active inductance and negative resistance includes a transistor having emitter, collector, and base electrodes, said emitter electrode connected to said common terminal, base circuit means connecting said base electrode to said reference potential terminal and collector circuit means connecting said collector electrode to said reference potential terminal.